United States Patent
Kim et al.

(10) Patent No.: US 9,660,194 B2
(45) Date of Patent: May 23, 2017

(54) COPOLYMER AND ORGANIC SOLAR CELL COMPRISING SAME

(71) Applicant: LG CHEM, LTD., Seoul (KR)

(72) Inventors: Jinseck Kim, Daejeon (KR); Songrim Jang, Daejeon (KR); Jaechol Lee, Daejeon (KR); Hangken Lee, Daejeon (KR); Keun Cho, Daejeon (KR); Jiwon Bang, Daejeon (KR); Jiyoung Lee, Daejeon (KR); Doowhan Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/912,326

(22) PCT Filed: Feb. 13, 2015

(86) PCT No.: PCT/KR2015/001491
§ 371 (c)(1),
(2) Date: Feb. 16, 2016

(87) PCT Pub. No.: WO2015/122722
PCT Pub. Date: Aug. 20, 2015

(65) Prior Publication Data
US 2016/0204349 A1    Jul. 14, 2016

(30) Foreign Application Priority Data
Feb. 14, 2014    (KR) .................. 10-2014-0017223

(51) Int. Cl.
*C08G 75/00* (2006.01)
*H01L 51/00* (2006.01)
(Continued)

(52) U.S. Cl.
CPC ........ *H01L 51/0036* (2013.01); *C08G 61/124* (2013.01); *C08G 61/126* (2013.01);
(Continued)

(58) Field of Classification Search
CPC . C08G 75/32; C08G 2261/91; H01L 51/0047; Y02E 10/549
See application file for complete search history.

(56) References Cited

U.S. PATENT DOCUMENTS

2013/0032209 A1    2/2013    Kim et al.
2013/0167929 A1    7/2013    Wen et al.
(Continued)

FOREIGN PATENT DOCUMENTS

EP    2692761 A1    2/2014
KR    10-2013-0016132 A    2/2013
(Continued)

OTHER PUBLICATIONS

G. Yu et al., "Polymer Photovoltaic Cells: Enhanced Efficiencies via a Network of Internal Donor-Acceptor Heterojunctions", Science, vol. 270, Dec. 15, 1995, pp. 1789-1791.
(Continued)

*Primary Examiner* — Shane Fang
(74) *Attorney, Agent, or Firm* — Dentons US LLP

(57) ABSTRACT

The present specification provides a copolymer and an organic solar cell including the same.

14 Claims, 1 Drawing Sheet

(51) Int. Cl.
C08G 61/12 (2006.01)
H01L 31/042 (2014.01)
H01L 51/42 (2006.01)
(52) U.S. Cl.
CPC ........ *H01L 31/042* (2013.01); *H01L 51/0043* (2013.01); *C08G 2261/12* (2013.01); *C08G 2261/148* (2013.01); *C08G 2261/149* (2013.01); *C08G 2261/1412* (2013.01); *C08G 2261/1424* (2013.01); *C08G 2261/3223* (2013.01); *C08G 2261/3225* (2013.01); *C08G 2261/3243* (2013.01); *C08G 2261/3246* (2013.01); *C08G 2261/344* (2013.01); *C08G 2261/411* (2013.01); *C08G 2261/414* (2013.01); *C08G 2261/91* (2013.01); *H01L 51/4253* (2013.01)

(56) References Cited

U.S. PATENT DOCUMENTS

| 2014/0053905 A1 | 2/2014 | Byrne et al. |
| 2014/0084220 A1 | 3/2014 | Inagaki et al. |
| 2014/0166942 A1* | 6/2014 | Izawa ................. H01L 51/0036 252/511 |
| 2014/0290747 A1 | 10/2014 | Kim et al. |

FOREIGN PATENT DOCUMENTS

| KR | 10-2013-0048175 A | 5/2013 |
| KR | 10-2013-0090821 A | 8/2013 |
| KR | 10-2013-0119916 A | 11/2013 |
| KR | 10-2015-0051577 A | 5/2015 |
| WO | 2012/124627 A1 | 9/2012 |
| WO | 2012/149189 A2 | 11/2012 |

OTHER PUBLICATIONS

C. Cabanetos, "Linear Side Chains in Benzo(1,2-b:4,5-b')dithiophene-Thieno[3,4-c]pyrrole-4,6-dione Polymers Direct Self Assembly and Solar Cell Performance", J. Am. Chem. Soc. 2013, 135, 4656-4659.

C.W. Tang, "Two-layer organic photovoltaic cell", Appl. Phys. Lett. 48 (2), Jan. 13, 1986, 183-185.

Kang, et al.: "Importance of Optimal Composition in Random Terpolymer-Based Polymer Solar Cells", XP055134883, Macromolecules, vol. 46, No. 17, Sep. 10, 2013.

Lu. et al.: "A facile strategy to enhance absorption coefficient and photovoltaic performance of two-dimensional benzo [1,2-b:4,b']dithiophene and thieno[3,4-c]pyrrole-4,6-dione polymers via subtle chemical structure variations", XP028707620, Organic Electronics, vol. 14, No. 10, Jul. 22, 2013.

Yuan, et al.: "Effect of a furan π-bridge on polymer coplanarity and performance in organic field effect transistors", XP055134885, Polymer Chemistry, vol. 4, No. 15, May 15, 2013.

Chung, et al.: "Highly Conjugated Side-Chain-Substituted Benzo[1,2-b:4,5-b']dithiophene-Based Conjugated Polymers for Use in Polymer Solar Cells", XP055321234, Macromolecules, vol. 47, No. 1, Jan. 14, 2014.

Jiang, et al.: "Side Chain Structure Affects the Photovoltaic Performance of Two-Dimensional Conjugated Polymers", XP055320964, Macromolecules, vol. 47, No. 1, Jan. 14, 2014.

* cited by examiner

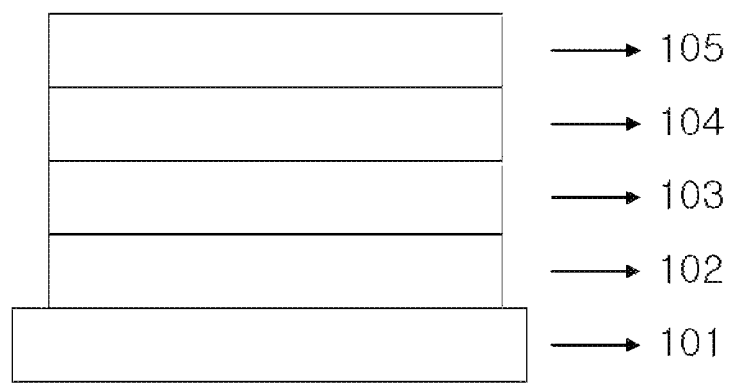

COPOLYMER AND ORGANIC SOLAR CELL COMPRISING SAME

TECHNICAL FIELD

This application is the National Phase Entry of PCT/KR2015/001491 filed on Feb. 13, 2015 and claims the benefit of Korean Patent Application No. 10-2014-0017223 filed on Feb. 14, 2014 in the Korean Intellectual Property Office, the disclosures of which are herein incorporated by reference in their entirety.

The present specification relates to a copolymer and an organic solar cell including the same.

BACKGROUND ART

An organic solar cell is a device that may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art already have shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of this solar cell, generating as many excitons as possible inside a semiconductor is important, but it is also important to pull the generated charges to the outside without loss. One of the reasons for the charge loss is the dissipation of generated electrons and holes due to recombination. Various methods have been proposed to deliver generated electrons and holes to an electrode without loss, but additional processes are required in most cases and accordingly, manufacturing costs may be increased.

DISCLOSURE

Technical Problem

An object of the present specification is to provide a copolymer and an organic solar cell including the same.

Technical Solution

The present specification provides a copolymer including: a first unit represented by the following Formula 1; a second unit represented by the following Formula 2; and a third unit represented by the following Formula 3.

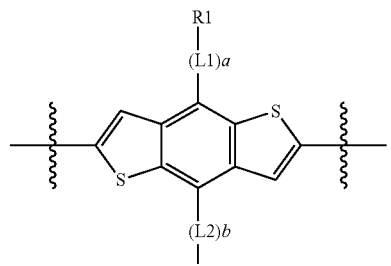

[Formula 1]

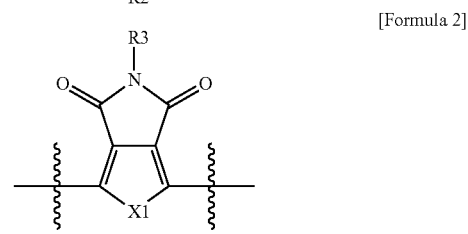

[Formula 2]

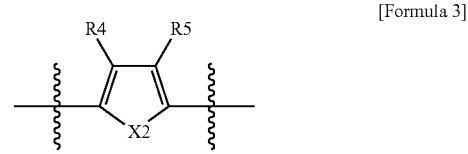

[Formula 3]

In Formulae 1 to 3, a and b are each an integer of 1 to 3, when a is 2 or more, two or more L1's are the same as or different from each other, when b is 2 or more, two or more L2's are the same as or different from each other, L1 and L2 are the same as or different from each other, and each independently have a conjugated structure, R1 and R2 are the same as or different from each other, and are each independently, as a substituent to be substituted in the conjugated structure of L1 and L2, one or two or more selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group including one or more of N, O, and S atoms, X1 and X2 are the same as or different from each other, and are each independently CRR', NR, O, SiRR', PR, S, GeRR', Se or Te, and R, R' and R3 to R5 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group including one or more of N, O, and S atoms.

Further, the present specification provides an organic solar cell including: a first electrode; a second electrode provided to face the first electrode; and an organic material layer including one or more layers, which is provided between the first electrode and the second electrode and includes a photoactive layer, in which one or more layers of the organic material layers include the above-described copolymer.

Advantageous Effects

The copolymer of the present specification may be used as a material for an organic material layer of an organic solar cell, and an organic solar cell including the same may exhibit characteristics which are excellent in an increase in open-circuit voltage and short-circuit current and/or an increase in efficiency, and the like.

The copolymer according to an exemplary embodiment of the present specification has a deep HOMO level, a small band gap, and a high charge mobility, and thus may exhibit excellent characteristics. A polymer according to an exemplary embodiment of the present specification may be used either alone or in mixture with other materials in an organic solar cell, may enhance the efficiency, and may enhance service life characteristics of a device due to thermal stability of the compound.

DESCRIPTION OF DRAWINGS

The FIGURE is a view illustrating an organic solar cell according to an exemplary embodiment of the present specification.

EXPLANATION OF REFERENCE NUMERALS AND SYMBOLS

101: Substrate
102: First electrode
103: Hole transport layer
104: Photoactive layer
105: Second electrode Mode for Invention Hereinafter, the present specification will be described in detail.

In the present specification, the 'unit' means a repeated structure included in a monomer of a copolymer, and a structure in which the monomer is bonded to the copolymer by polymerization.

In the present specification, the meaning of 'including a unit' means that the unit is included in a main chain in the polymer.

A copolymer according to an exemplary embodiment of the present specification includes: a first unit represented by Formula 1; a second unit represented by Formula 2; and a third unit represented by Formula 3.

The copolymer according to an exemplary embodiment of the present specification is prepared by three monomers. In this case, the synthesis scheme becomes simple, so that the copolymer is easily synthesized.

The copolymer according to an exemplary embodiment of the present specification is a random copolymer. In the case of a random copolymer, the crystallinity becomes reduced, and thus the degree of amorphousness is increased, so that a long-term stability to heat may be secured, and a process of manufacturing a device and a module including the copolymer becomes easy.

In the copolymer, the molar ratio of each of the first unit, the second unit, and the third unit is not particularly limited.

With respect to the total sum of the number of moles of the first unit, the second unit, and the third unit, the molar ratio of the sum of the first unit and the third unit may be 0.5 or more. In other words, when the total sum of the number of moles of the first unit, the second unit, and the third unit is defined as 1, the molar ratio of the sum of the number of moles of the first unit and the third unit may be 0.5 or more.

In addition, since the solubility is easily adjusted by adjusting the ratio between the copolymers in the random copolymer, it may be easy to provide the solubility suitable for the process of manufacturing an organic solar cell, thereby manufacturing an organic solar cell with high efficiency.

In an exemplary embodiment of the present specification, the copolymer including the first unit, the second unit, and the third unit has a deep highest occupied molecular orbital (HOMO) energy level and a high charge mobility, and thus, is appropriate as an electron donor material of the organic solar cell.

Furthermore, in an exemplary embodiment of the present specification, the first unit is substituted with L1 and L2, and thus, includes a conjugated structure in a side chain thereof. In this case, the copolymer according to an exemplary embodiment of the present specification may have effects of decreasing a band gap and/or increasing an amount of absorbing light.

A variation in the side chain used in the organic solar cell changes physical and chemical characteristics, such as the solubility of a polymer used as an entire electron donor, and when the copolymer is included either alone or in a film form while a material mixed with the electron acceptor is coated on the organic solar cell, in the organic solar cell, the morphology of the film may be adjusted, thereby greatly affecting the efficiency of the organic solar cell.

With respect to the above content, it can be confirmed in Clement Cabanetos, Abdulrahman El Labban, Jonathan A. Bartelt, Jessica D. Douglas, William R. Mateker, Jean M. J. Frechet, Michael D. McGehee, and Pierre M. Beaujuge, J. Am. Chem. Soc., 2013, 135 (12), pp 4656-4659 that the electron donor polymer having the same main chain may have a difference in efficiency by up to 200% depending on the change in side chain thereof.

A conjugated structure (L1 and L2) as a side chain is introduced into the copolymer according to an exemplary embodiment of the present specification, thereby leading to a decrease in the band gap, an increase in the charge mobility, an increase in amount of light absorbed in a broad region of the visible light region, and/or an increase in the planarity of molecules. In this case, interaction between molecules is increased and layers are stacked well, thereby increasing the efficiency of the organic solar cell.

However, when the conjugated structure is substituted at another position in which planarity of the main chain is not sufficiently considered, the planarity of the main chain may deteriorate, and the efficiency may be reduced. In addition, when a conjugated structure is introduced into the side chain of a copolymer in which the planarity of the main chain is not sufficiently considered, the solubility of the entire copolymer is reduced, so that the polymer may not be appropriate as an electron donor material of an organic solar cell.

For the copolymer according to an exemplary embodiment of the present specification, the conjugated structure may be introduced into the positions of L1 and L2 of Formula 1, which does not affect the planarity of the main chain due to the steric hindrance of the polymer, thereby increasing the planarity of the molecules and the efficiency while maintaining an appropriate solubility of the copolymer which may be applied to the device.

Therefore, according to an exemplary embodiment of the present specification, a copolymer including a first unit, a second unit, and a third unit in which the side chain of the first unit includes a conjugated structure (L1 and L2) may be included as an electron donor material in a device, and the device including the copolymer may implement high efficiency.

Furthermore, the copolymer according to an exemplary embodiment of the present specification implements high efficiency and simultaneously has an appropriate solubility, and thus, has an economical advantage in terms of time and/or costs during the manufacture of a device.

The copolymer according to an exemplary embodiment of the present specification may be composed only of: the first unit represented by Formula 1; the second unit represented by Formula 2; and the third unit represented by Formula 3. In other words, the copolymer may not further include a repeating unit which is not included in the first unit represented by Formula 1; the second unit represented by Formula 2; and the third unit represented by Formula 3. In an exemplary embodiment of the present specification, the copolymer includes a unit represented by the following Formula 4.

[Formula 4]

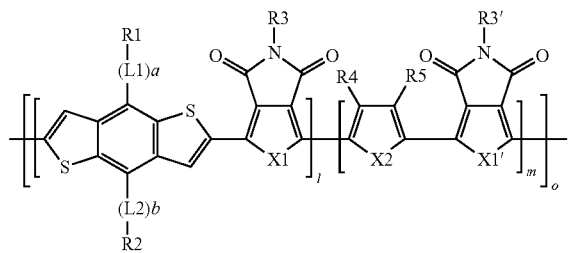

In Formula 4,
a, b, L1, L2, X1, X2, and R1 to R5 are the same as those defined above,
X1' is the same as or different from X1, and is each independently the same as the definition of X1,
R3' is the same as or different from R3, and is each independently the same as the definition of R3,
l is a molar ratio, and 0<l<1,
m is a molar ratio, and 0<m<1,
l+m=1, and
o is an integer with 0<o<1,000.

Examples of the substituents will be described below, but are not limited thereto.

In the present specification,

means a site which is connected to the main chain of the copolymer or a site which is connected to another substituent.

In the present specification, the term "substituted or unsubstituted" means being substituted with one or more substituents selected from the group consisting of deuterium; a halogen group; an alkyl group; an alkenyl group; an alkoxy group; a cycloalkyl group; a silyl group; an arylalkenyl group; an aryloxy group; an alkylthioxy group; an alkylsulfoxy group; an arylsulfoxy group; a boron group; an alkylamine group; an aralkylamine group; an arylamine group; a heteroaryl group; an arylamine group; an aryl group; a nitrile group; a nitro group; a hydroxyl group; and a heterocyclic group including one or more of N, O, and S atoms, or having no substituent.

The substituent may be unsubstituted or substituted with an additional substituent.

In the present specification, the halogen group may be fluorine, chlorine, bromine or iodine.

In the present specification, the number of carbon atoms of the imide group is not particularly limited, but is preferably 1 to 25. Specifically, the imide may be a compound having the following structure, but is not limited thereto.

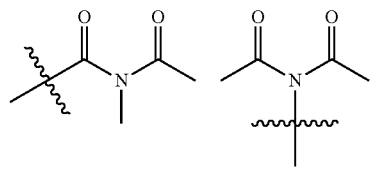

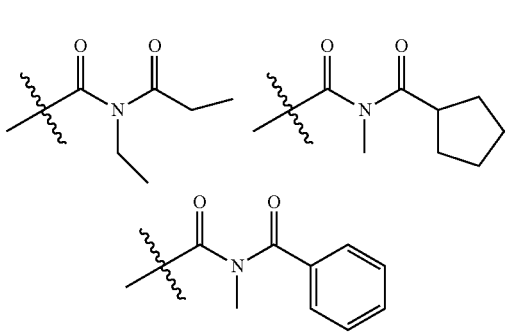

In the present specification, for the amide group, a nitrogen of the amide group may be substituted with one or two selected from the group of hydrogen, a straight, branched, or cyclic alkyl group having 1 to 25 carbon atoms, or an aryl group having 6 to 25 carbon atoms. Specifically, the amide group may be a compound having the following structure, but is not limited thereto.

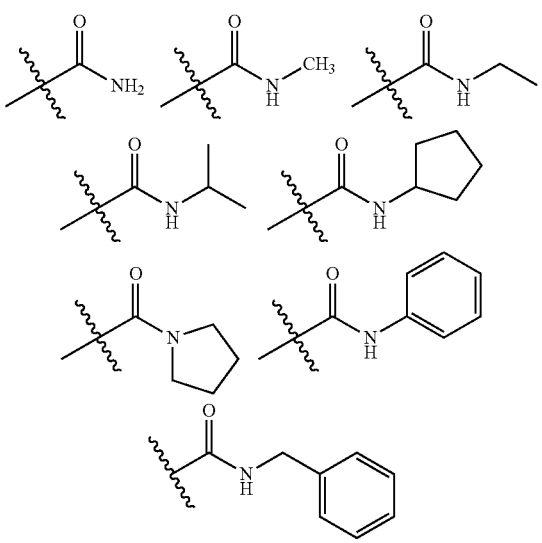

In the present specification, the alkyl group may be straight or branched, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl, and the like, but are not limited thereto.

In the present specification, the cycloalkyl group is not particularly limited, but is preferably a cycloalkyl group having 3 to 60 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, the aryl group may be a monocyclic aryl group or a polycyclic aryl group, and the number of carbon atoms is not limited, but may be 6 to 50. When the aryl group is a monocyclic aryl group, the aryl group may be a phenyl group, a biphenyl group, a terphenyl group, and the like, but is not limited thereto. When the aryl group is a polycyclic aryl group, specific examples thereof include a naphthyl group, an anthracenyl group, a phenanthryl group, a pyrenyl group, a perylenyl group, a chrysenyl group, a fluorenyl group, and the like, but are not limited thereto.

In the present specification, the aryl group may mean an aromatic ring.

In the present specification, the fluorenyl group may be substituted, and adjacent substituents may combine with each other to form a ring.

When the fluorenyl group is substituted, the fluorenyl group may be

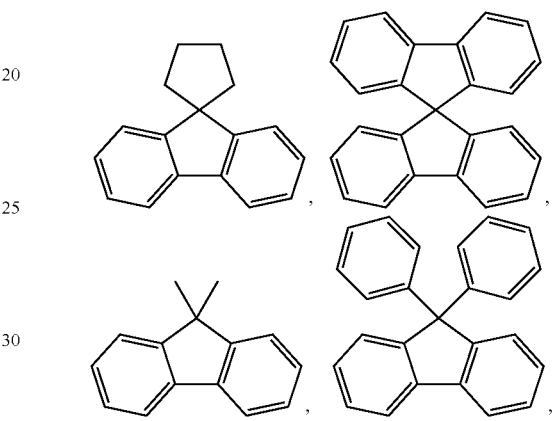

and the like. However, the fluorenyl group is not limited thereto.

In the present specification, specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group which has two or more of the aryl group may include a monocyclic aryl group, a polycyclic aryl group, or both a monocyclic aryl group and a polycyclic aryl group.

Specific examples of the arylamine group include phenylamine, naphthylamine, biphenylamine, anthracenylamine, 3-methyl-phenylamine, 4-methyl-naphthylamine, 2-methyl-biphenylamine, 9-methyl-anthracenylamine, a diphenylamine group, a phenylnaphthylamine group, a ditolylamine group, a phenyltolylamine group, carbazole, a triphenylamine group, and the like, but are not limited thereto.

In the present specification, a heterocyclic group is a heterocyclic group including one or more of O, N, and S as a hetero element, and the number of carbon atoms thereof is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the aryl group in the aryloxy group, the arylthioxy group, the arylsulfoxy group, and the aralkylamine group is the same as the above-described examples of the aryl group. Specifically, examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the arylsulfoxy group is not limited thereto.

In the present specification, the heteroaryl group in the heteroarylamine group may be selected from the above-described examples of the heterocyclic group.

In the present specification, the alkyl group in the alkylthioxy group and the alkylsulfoxy group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the alkylthioxy group is not limited thereto.

In an exemplary embodiment of the present specification, the conjugated structure includes: an arylene group; an aromatic heterocyclic group including one or more of N, O, S, Se, Te, Ge, and P atoms; or one or two or more vinylene groups.

In the present specification, the aromatic heterocyclic group is a divalent monocyclic or polycyclic hetero ring, may be selected from the above-described examples of the heterocyclic group, and is not limited thereto.

Further, in the present specification, the arylene group is a divalent monocyclic or polycyclic hydrocarbon ring, may be selected from the above-described examples of the aryl group, and is not limited thereto.

In the present specification, inclusion of one or two or more vinylene groups is straight or cyclic atoms including one or more vinylene group, and includes a structure in which a double bond and a single bond are alternately exhibited, including one or two or more vinylene groups.

In an exemplary embodiment of the present specification, R1 and R2 are the same as or different from each other, and are each independently a substituted or unsubstituted, straight or branched alkyl group having 1 to 20 carbon atoms; or a substituted or unsubstituted, straight or branched alkoxy group having 1 to 20 carbon atoms.

In an exemplary embodiment of the present specification, R3 to R5 are the same as or different from each other, and are each independently hydrogen; or a substituted or unsubstituted, straight or branched alkyl group having 1 to 20 carbon atoms.

In an exemplary embodiment of the present specification, X1 is S.

In another exemplary embodiment, X1' is S.

In an exemplary embodiment of the present specification, X2 is S.

In another exemplary embodiment, R1 is a substituted or unsubstituted alkyl group.

In still another exemplary embodiment, R1 is a substituted or unsubstituted, branched alkyl group.

In an exemplary embodiment of the present specification, R1 is a 2-ethyl hexyl group.

In an exemplary embodiment of the present specification, R1 is a substituted or unsubstituted alkoxy group.

In an exemplary embodiment of the present specification, R1 is a branched alkoxy group.

In another exemplary embodiment, R1 is a 2-ethyl hexyloxy group.

In an exemplary embodiment of the present specification, R2 is a substituted or unsubstituted alkyl group.

In another exemplary embodiment, R2 is a substituted or branched alkyl group.

In still another exemplary embodiment, R2 is a 2-ethyl hexyl group.

In an exemplary embodiment of the present specification, R2 is a substituted or unsubstituted alkoxy group.

In another exemplary embodiment, R2 is a branched alkoxy group.

In an exemplary embodiment of the present specification, R2 is a 2-ethyl hexyloxy group.

In an exemplary embodiment of the present specification, R3 is a substituted or unsubstituted alkyl group.

In another exemplary embodiment, R3 is a straight alkyl group.

In an exemplary embodiment of the present specification, R3 is a dodecanyl group.

In an exemplary embodiment of the present specification, R3 is an octyl group.

In an exemplary embodiment of the present specification, R3' is a substituted or unsubstituted alkyl group.

In another exemplary embodiment, R3' is a straight alkyl group.

In still another exemplary embodiment, R3' is an octyl group.

In an exemplary embodiment of the present specification, R4 is hydrogen.

In another exemplary embodiment, R5 is hydrogen.

In an exemplary embodiment of the present specification, L1 is an arylene group.

In another exemplary embodiment, L1 is a phenylene group.

In an exemplary embodiment of the present specification, L1 is a divalent aromatic heterocyclic group including one or more of N, O, and S atoms.

In another exemplary embodiment, L1 is a divalent aromatic heterocyclic group including one or more S atoms.

In still another exemplary embodiment, L1 is a thiophene group.

In an exemplary embodiment of the present specification, L1 includes one or two or more vinylene groups.

In an exemplary embodiment of the present specification, L1 is an alkenylene group.

In an exemplary embodiment of the present specification, L1 is an ethenylene group.

In an exemplary embodiment of the present specification, a is 1.

In an exemplary embodiment of the present specification, a is 3.

In an exemplary embodiment of the present specification, (L1) a is a di(thiophen-2-yl)ethene group.

In an exemplary embodiment of the present specification, L2 is an arylene group.

In another exemplary embodiment, L2 is a phenylene group.

In an exemplary embodiment of the present specification, L2 is a divalent aromatic heterocyclic group including one or more of N, O, and S atoms.

In another exemplary embodiment, L2 is a divalent aromatic heterocyclic group including one or more S atoms. In still another exemplary embodiment, L2 is a thiophene group.

In an exemplary embodiment of the present specification, L2 includes one or two or more vinylene groups.

In an exemplary embodiment of the present specification, L2 is an alkenylene group.

In an exemplary embodiment of the present specification, L2 is an ethenylene group.

In an exemplary embodiment of the present specification, b is 1.

In an exemplary embodiment of the present specification, b is 3.

In an exemplary embodiment of the present specification, (L2) b is a di(thiophen-2-yl)ethene group.

In an exemplary embodiment of the present specification, the copolymer is a copolymer represented by any one of the following Formulae 1-1 to 1-5.

[Formula 1-1]

[Formula 1-2]

[Formula 1-3]
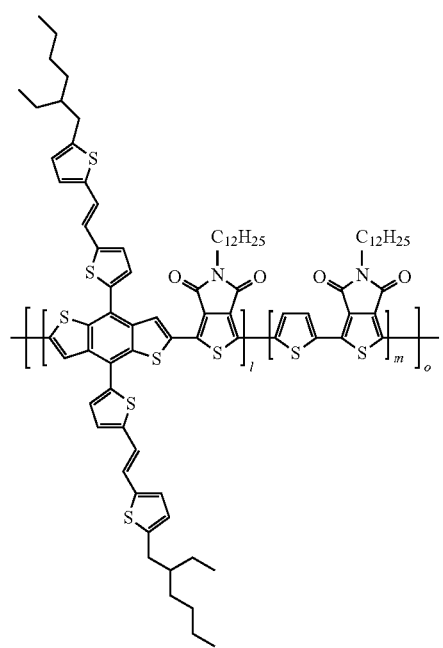
[Formula 1-4]
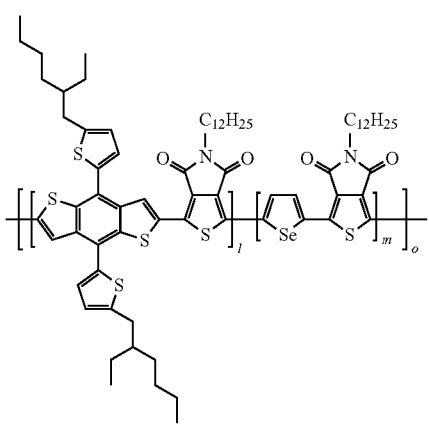
[Formula 1-5]
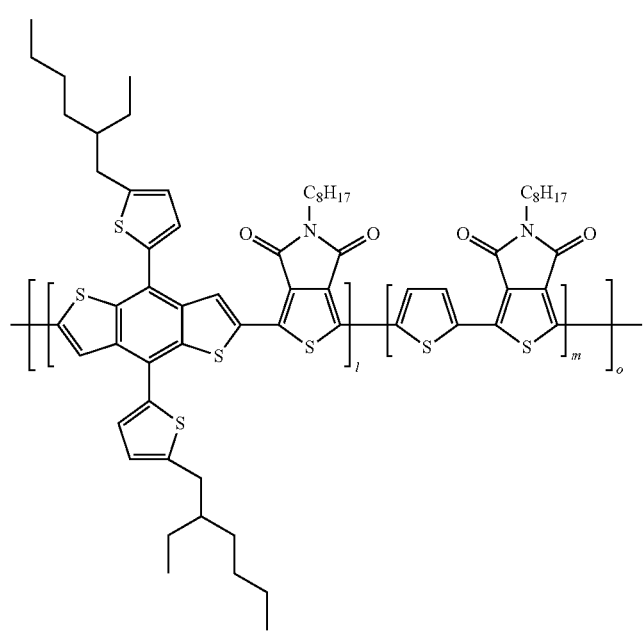

In Formulae 1-1 to 1-5, the definition of l, m, and o is the same as that defined above.

In an exemplary embodiment of the present specification, l is 0.5.

In another exemplary embodiment, m is 0.5.

In an exemplary embodiment of the present specification, an end group of the copolymer is a heterocyclic group or an aryl group.

In an exemplary embodiment of the present specification, an end group of the copolymer is a 4-(trifluoromethyl) phenyl group.

In an exemplary embodiment of the present specification, a number average molecular weight of the copolymer is preferably 500 g/mol to 1,000,000 g/mol. Preferably, a number average molecular weight of the copolymer is preferably 10,000 to 100,000. In an exemplary embodiment of the present specification, a number average molecular weight of the copolymer is 30,000 to 70,000.

In an exemplary embodiment of the present specification, the copolymer may have a molecular weight distribution of 1 to 100. Preferably, the copolymer has a molecular weight distribution of 1 to 3.

The lower the molecular weight distribution is and the higher the number average molecular weight becomes, the better electrical characteristics and mechanical characteristics become.

Further, it is preferred that the number average molecular weight is 100,000 or less, such that the copolymer has a predetermined or more solubility, and accordingly, a solution application method is advantageously applied.

The copolymer may be prepared based on the preparation examples to be described below.

A solvent, three monomers derived from the first unit to the third unit represented by Formulae 1 to 3, and a catalyst are put into a reactor, and the resulting mixture is reacted through a Suzuki coupling reaction, a Stille coupling reaction, or other various reactions, and end-capped.

After the reaction, the mixture is cooled to room temperature and poured into methanol, the solid is filtered and Soxhlet extracted with methanol, acetone, hexane, and chloroform, and then the copolymer may be prepared by precipitating the chloroform part in methanol again and filtering the solid.

The copolymer according to the present specification may be prepared by a multi-step chemical reaction. Monomers are prepared through an alkylation reaction, a Grignard reaction, a Suzuki coupling reaction, a Stille coupling reaction, and the like, and then final copolymers may be prepared through a carbon-carbon coupling reaction such as a Stille coupling reaction. When the substituent to be introduced is boronic acid or a boronic ester compound, the copolymer may be prepared through a Suzuki coupling reaction, and when the substituent to be introduced is a tributyltin compound, the copolymer may be prepared through a Stille coupling reaction, but the chemical reaction is not limited thereto.

In an exemplary embodiment of the present specification, provided is an organic solar cell including: a first electrode; a second electrode provided to face the first electrode; and an organic material layer including one or more layers, which is provided between the first electrode and the second electrode and includes a photoactive layer, in which one or more layers of the organic material layers include the copolymer.

The organic solar cell according to an exemplary embodiment of the present specification includes a first electrode, a photoactive layer, and a second electrode. The organic solar cell may further include a substrate, a hole transport layer, and/or an electron transport layer.

In an exemplary embodiment of the present specification, when the organic solar cell receives a photon from an external light source, an electron and a hole are generated between the electron donor and the electron acceptor. The generated hole is transported to a positive electrode through an electron donor layer.

In an exemplary embodiment of the present specification, the organic material layer includes a hole transport layer, a hole injection layer, or a layer which simultaneously transports and injects holes, and the hole transport layer, the hole injection layer, or the layer which simultaneously transports and injects holes includes the copolymer.

In another exemplary embodiment, the organic material layer includes an electron injection layer, an electron transport layer, or a layer which simultaneously injects and transports electrons, and the electron injection layer, the electron transport layer, or the layer which simultaneously injects and transports electrons includes the copolymer.

In an exemplary embodiment of the present specification, when the organic solar cell receives a photon from an external light source, an electron and a hole are generated between the electron donor and the electron acceptor. The generated hole is transported to a positive electrode through the electron donor layer.

In an exemplary embodiment of the present specification, the organic solar cell may further include one or two or more organic material layers selected from the group consisting of a hole injection layer, a hole transport layer, a hole blocking layer, a charge generation layer, an electron blocking layer, an electron injection layer, and an electron transport layer.

In an exemplary embodiment of the present specification, the organic solar cell may further include an additional organic material layer. The organic solar cell may reduce the number of organic material layers therein by using an organic material which simultaneously has various functions.

In an exemplary embodiment of the present specification, in the organic solar cell, a cathode, a photoactive layer, and an anode may be arranged in this order, and an anode, a photoactive layer, and a cathode may be arranged in this order, but the order is not limited thereto.

In another exemplary embodiment, in the organic solar cell, the anode, the hole transport layer, the photoactive layer, the electron transport layer, and the cathode may also be arranged in this order, and the cathode, the electron transport layer, the photoactive layer, the hole transport layer, and the anode may also be arranged in this order, but the order is not limited thereto.

In still another exemplary embodiment, a buffer layer may be provided between the photoactive layer and the hole transport layer, or between the photoactive layer and the electron transport layer. In this case, a hole injection layer may be further provided between the anode and the hole transport layer. Further, an electron injection layer may be further provided between the cathode and the electron transport layer.

In an exemplary embodiment of the present specification, the photoactive layer includes one or two or more selected from the group consisting of an electron donor and an electron acceptor, and the electron donor includes the copolymer.

In an exemplary embodiment of the present specification, the electron acceptor material may be selected from the group consisting of fullerene, fullerene derivatives, bathocuproine, semi conductive elements, semi conductive compounds, and combinations thereof. Specifically, the electron acceptor material may be phenyl $C_{61}$-butyric acid methyl ester ($PC_{61}BM$) or phenyl $C_{71}$-butyric acid methyl ester ($PC_{71}BM$).

In an exemplary embodiment of the present specification, the electron donor and the electron acceptor constitute a bulk heterojunction (BHJ). The electron donor material and the electron acceptor material may be mixed at a ratio (w/w) of 1:10 to 10:1. Specifically, the electron donor material and the electron acceptor material may be mixed at a ratio (w/w) of 1:1 to 1:10, and more specifically, the electron donor material and the electron acceptor material may be mixed at a ratio (w/w) of 1:1 to 1:5. If necessary, the electron donor material and the electron acceptor material may be mixed at a ratio (w/w) of 1:1 to 1:3.

In an exemplary embodiment of the present specification, the photoactive layer has a bilayer thin film structure including an n-type organic material layer and a p-type organic material layer, and the p-type organic material layer includes the copolymer.

In the present specification, the substrate may be a glass substrate or a transparent plastic substrate having excellent transparency, surface smoothness, handleability, and water proof properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The anode electrode may be made of a material which is transparent and has excellent conductivity, but is not limited thereto. Examples thereof include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDT), polypyrrole, and polyaniline, and the like, but are not limited thereto.

A method of forming the anode electrode is not particularly limited, but the anode electrode may be formed, for example, by being applied onto one surface of a substrate using sputtering, e-beam, thermal deposition, spin coating, screen printing, inkjet printing, doctor blade, or a gravure printing method, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film is easily formed on an anode electrode, and the quality of the thin film may also be enhanced.

Examples of a pre-treatment technology for an anode electrode include a) a surface oxidation method using a parallel plate-type discharge, b) a method of oxidizing the surface through ozone produced by using UV (ultraviolet) rays in a vacuum state, c) an oxidation method using oxygen radicals produced by plasma, and the like.

One of the methods may be selected depending on the state of the anode electrode or the substrate. However, even though any method is used, it is preferred to commonly prevent oxygen from being separated from the surface of the anode electrode or the surface, and maximally inhibit moisture and organic materials from remaining. In this case, it is possible to maximize a substantial effect of the pre-treatment.

As a specific example, it is possible to use a method of oxidizing the surface through ozone produced by using UV. In this case, an ITO substrate patterned after being ultrasonically cleaned is baked on a hot plate and dried well, and then introduced into a chamber, and the ITO substrate patterned may be cleaned by ozone generated by reacting an oxygen gas with UV light by operating an UV lamp.

However, the surface modification method of the ITO substrate patterned in the present specification needs not be particularly limited, and any method may be used as long as the method is a method of oxidizing a substrate.

The cathode electrode may be a metal having a low work function, but is not limited thereto. Specific examples thereof include a metal, such as magnesium, calcium, sodium, potassium, titanium, indium, yttrium, lithium, gadolinium, aluminum, silver, tin, and lead, or alloys thereof; and a multi-layered material, such as LiF/Al, $LiO_2$/Al, LiF/Fe, Al:Li, Al:$BaF_2$, and Al:$BaF_2$:Ba, but are not limited thereto.

The cathode electrode may be deposited and formed in a thermal evaporator showing a vacuum degree of $5\times10^{-7}$ torr or less, but the forming method is not limited to this method.

The hole transport layer and/or electron transport layer materials serve to efficiently transfer electrons and holes separated from a photoactive layer to the electrode, and the materials are not particularly limited.

The hole transport layer material may be poly(3,4-ethylenediocythiophene) doped with poly(styrenesulfonic acid) (PEDOT:PSS) and molybdenum oxide ($MoO_x$); vanadium oxide ($V_2O_5$); nickel oxide (NiO); and tungsten oxide ($WO_x$), and the like, but is not limited thereto.

The electron transport layer material may be electron-extracting metal oxides, and specific examples thereof include: a metal complex of 8-hydroxyquinoline; a complex including $Alq_3$; a metal complex including Liq; LiF; Ca;

titanium oxide (TiO$_x$); zinc oxide (ZnO); and cesium carbonate (Cs$_2$CO$_3$), and the like, but are not limited thereto.

The photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

A preparation method of the copolymer and the manufacture of an organic solar cell including the same will be described in detail in the following Preparation Examples and Examples. However, the following Examples are provided for exemplifying the present specification, and the scope of the present specification is not limited thereby.

Mode for Invention

A preparation method of the copolymer and the manufacture of an organic solar cell including the same will be specifically described in the following Examples. However, the following Examples are provided for exemplifying the present specification, and the scope of the present specification is not limited thereby.

EXAMPLE 1

Synthesis of Copolymer 1

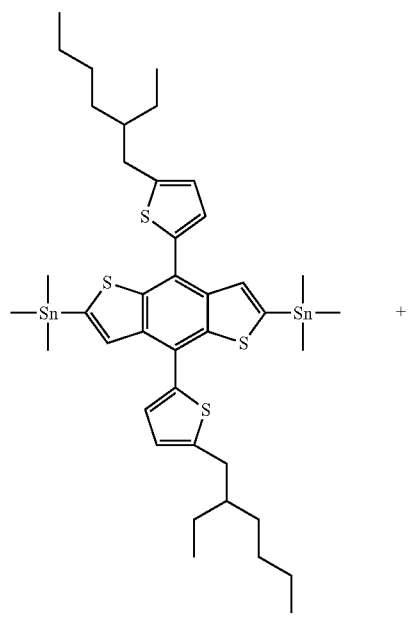

+

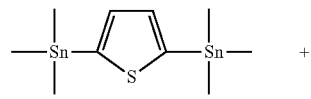

+

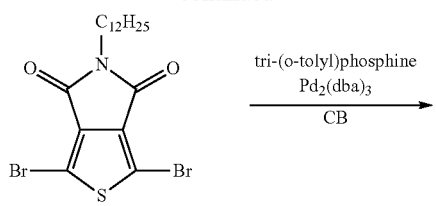

-continued

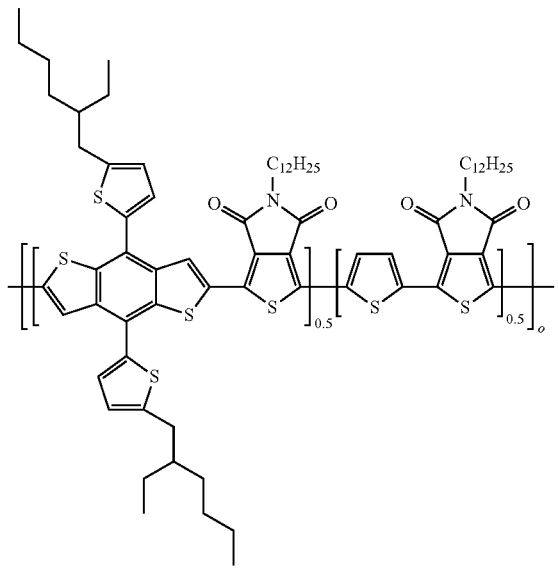

15 ml of chlorobenzene, 2,6-bis(trimethyltin)-4,8-bis(2-ethylhexyl-2-thienyl)-benzo[1,2-b:4,5-b']dithiophene (0.7 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.7418 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

EXAMPLE 2

Synthesis of Copolymer 2

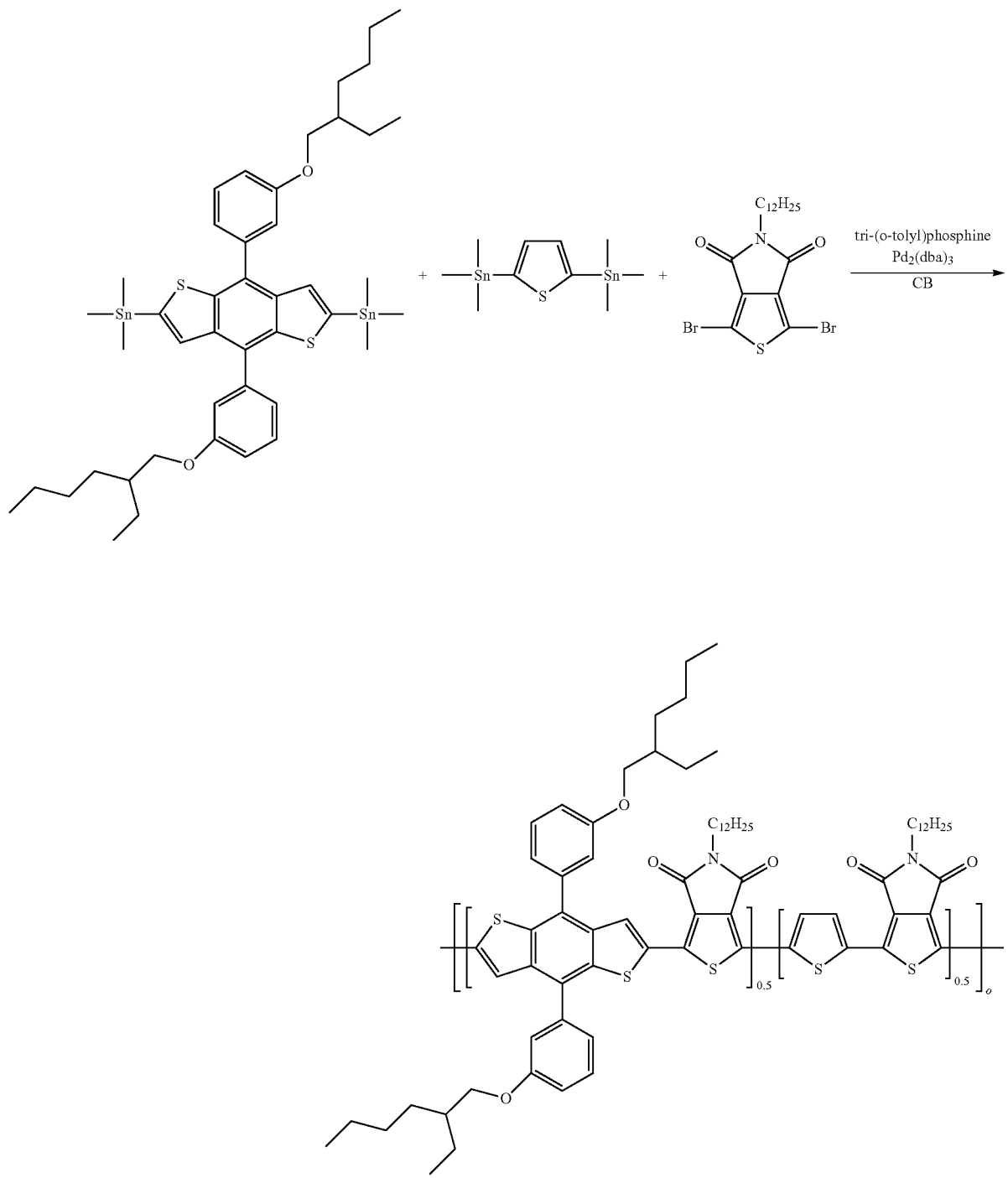

15 ml of chlorobenzene, 2,6-bis(trimethyltin)-4,8-bis(3-((2-ethylhexyl)oxy)phenyl)-benzo[1,2-b:4,5-b']dithiophene (0.7154 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.7418 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

EXAMPLE 3

Synthesis of Copolymer 3

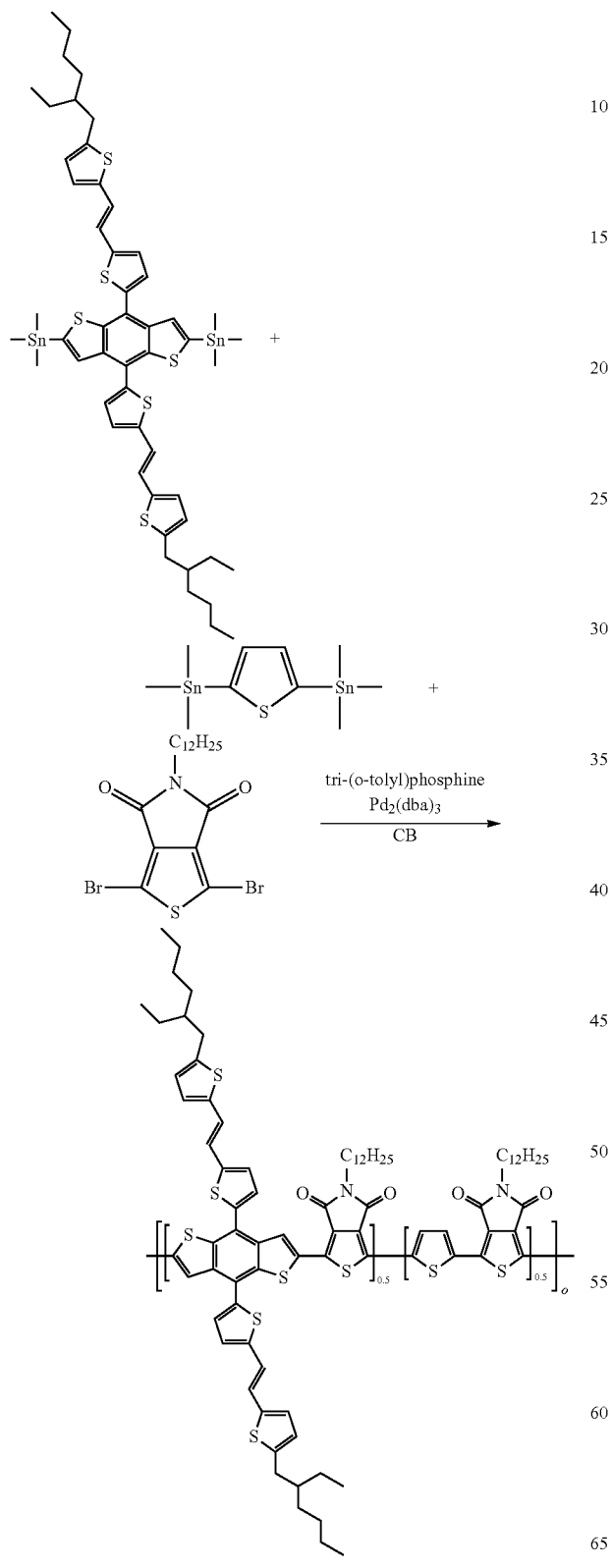

15 ml of chlorobenzene, 2,6-bis(trimethyltin)-4,8-bis(5-((E)-2-(5-(2-ethylhexyl)thiophen-2-yl)vinyl)thiophen-2-yl)-benzo[1,2-b:4,5-b']dithiophene (0.8673 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.7418 g, 1.548 mmol), 28 mg of tris(dibenzylideneacetone)dipalladium(0) ($Pd_2(dba)_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

EXAMPLE 4

Synthesis of Copolymer 4

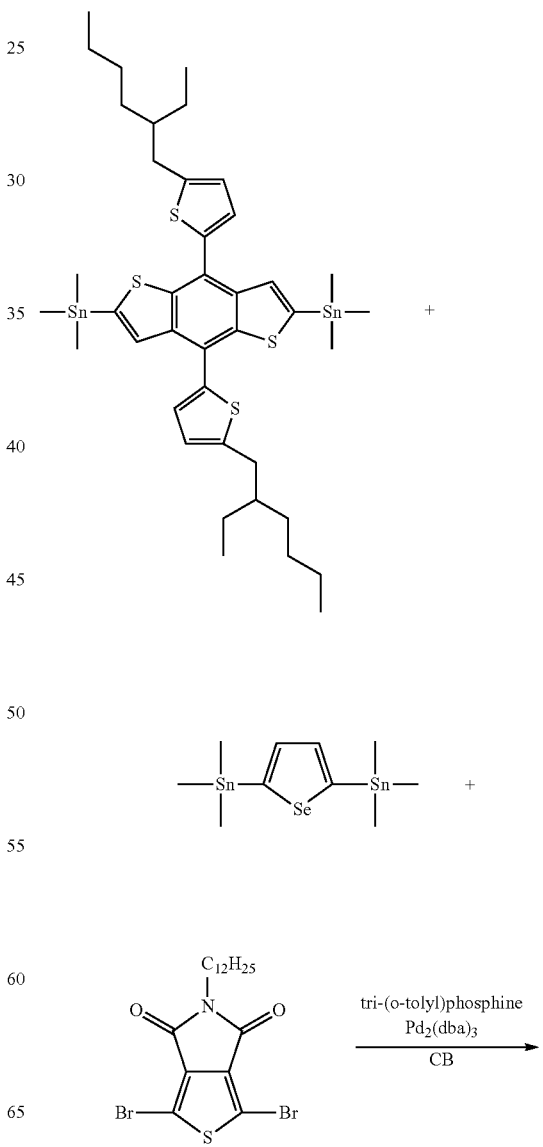

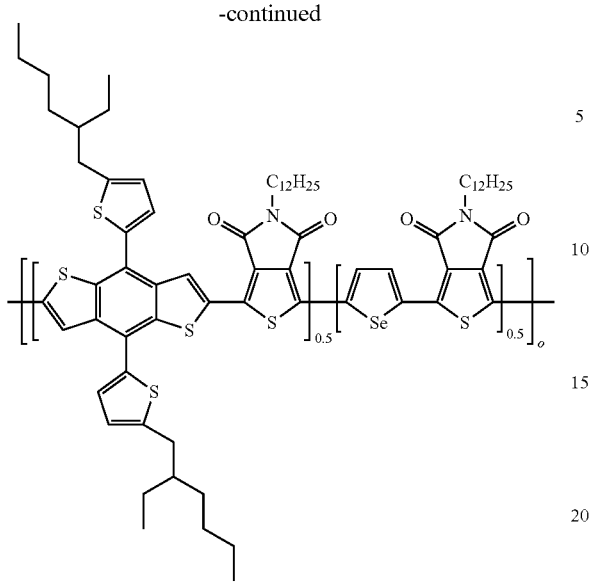

15 ml of chlorobenzene, 2,6-bis(trimethyltin)-4,8-bis(2-ethylhexyl-2-thienyl)-benzo[1,2-b:4,5-b']dithiophene (0.7 g, 0.7738 mmol), 2,5-bis(trimethylstannyl)selenophene (0.3533 g, 0.7738 mmol), 1,3-dibromo-5-dodecylthieno[3,4-c]pyrrole-4,6-dione (0.7418 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

EXAMPLE 5

Synthesis of Copolymer 5

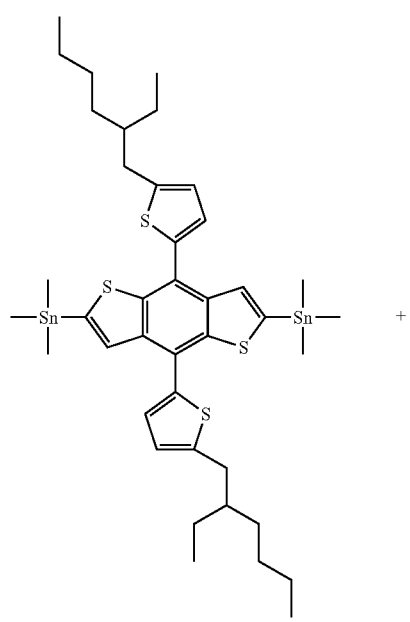

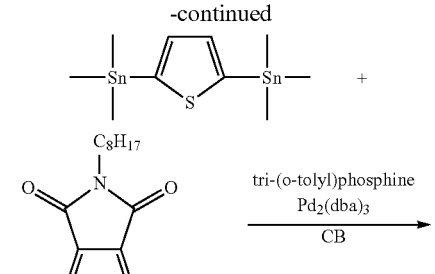

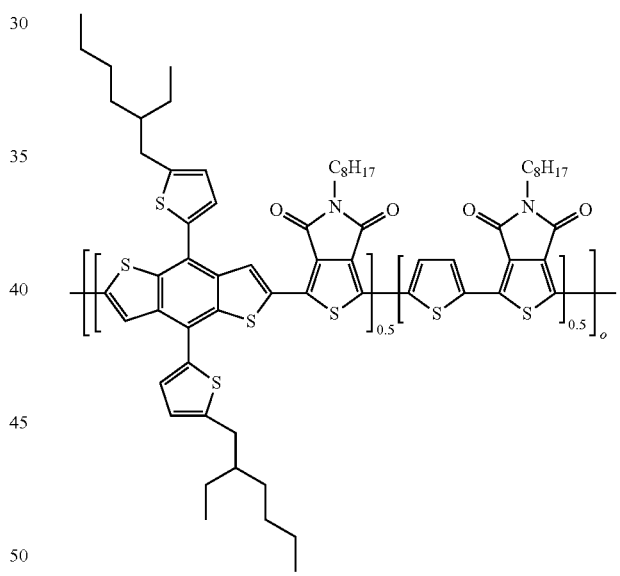

15 ml of chlorobenzene, 2,6-bis(trimethyltin)-4,8-bis(2-ethylhexyl-2-thienyl)-benzo[1,2-b:4,5-b']dithiophene (0.7 g, 0.7738 mmol), 2,5-bis(trimethylstannyl)thiophene (0.3171 g, 0.7738 mmol), 1,3-dibromo-5-octylthieno[3,4-c]pyrrole-4,6-dione (0.6549 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

COMPARATIVE EXAMPLE 1

Synthesis of Copolymer 6

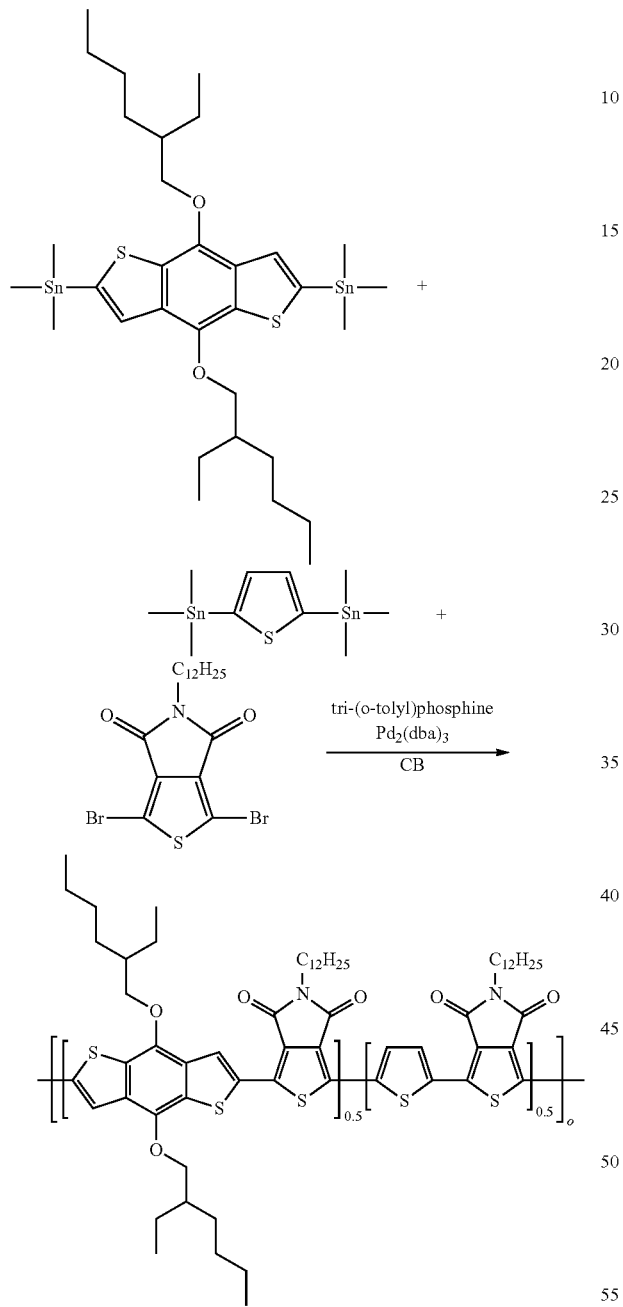

15 ml of chlorobenzene, 2,6-bis(trimethyltin)-4,8-bis(2-ethylhexyloxy)benzo[1,2-b:4,5-b']dithiophene (0.5976 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.7418 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

COMPARATIVE EXAMPLE 2

Synthesis of Copolymer 7

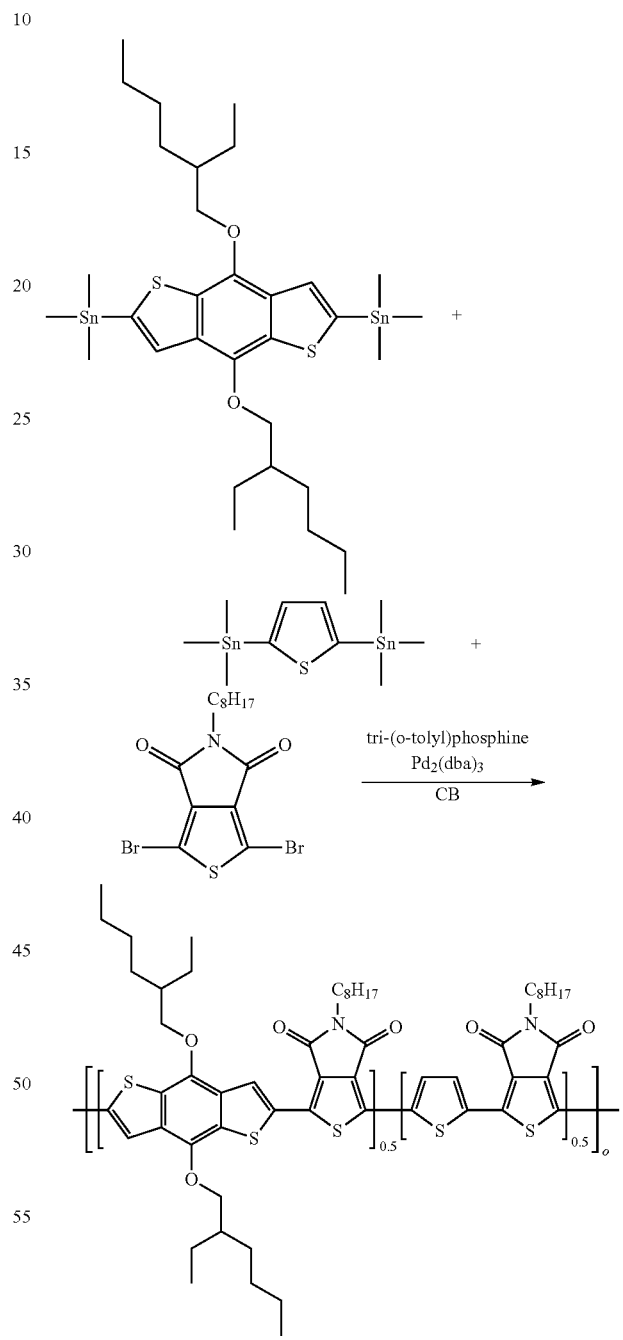

15 ml of chlorobenzene, 2,6-bis(trimethyltin)-4,8-bis(2-ethylhexyloxy)benzo[1,2-b:4,5-b']dithiophene (0.5976 g, 0.7738 mmol), 2,5-bis(trimethylstannyl)thiophene (0.3171 g, 0.7738 mmol), 1,3-dibromo-5-dodecylthieno[3,4-c]pyrrole-4,6-dione (0.6550 g, 1.548 mmol), 28 mg of tris(dibenzylideneacetone)dipalladium(0) (Pd$_2$(dba)$_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

COMPARATIVE EXAMPLE 3

Synthesis of Copolymer 8

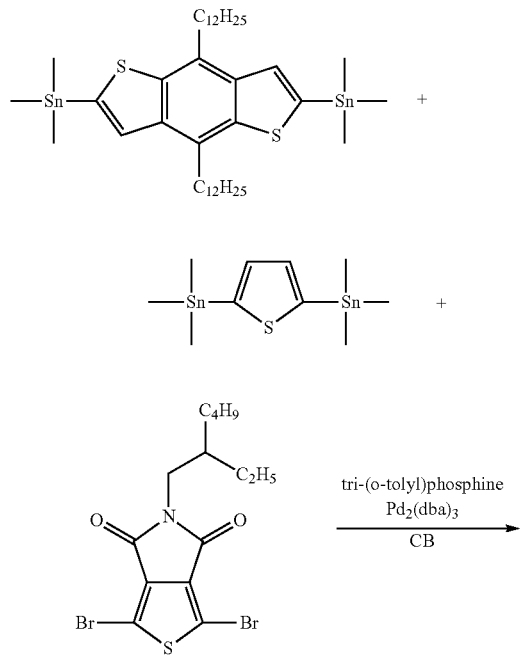

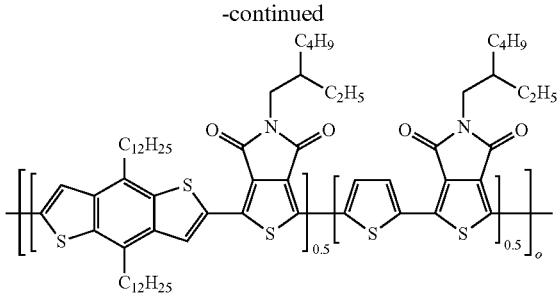

5 ml of chlorobenzene, 2,6-bis(trimethyltin)-4,8-didodecyl-benzo[1,2-b:4,5-b']dithiophene (0.3410 g, 0.4000 mmol), 2,5-bis(trimethylstannyl)thiophene (0.1639 g, 0.4000 mmol), 1,3-dibromo-5-(2-ethylhexyl)thieno[3,4-c]pyrrole-4,6-dione (0.3387 g, 0.8000 mmol), 14.7 mg of tris(dibenzylideneacetone)dipalladium(0) ($Pd_2(dba)_3$), and 19.5 mg of tri-(o-tolyl)phosphine were put into a round bottom flask, and reacted under the condition of 140° C.

For the reaction, tributyl-phenyl-stannane (0.26 ml, 0.8 mmol) and bromobenzene (0.13 ml, 1.2 mmol) were reacted under the condition of 140° C. for 1 hour and end-capped. After the reaction terminated, the polymer was precipitated and Soxhlet extracted, and then the chloroform part was precipitated again in methanol and the solid was filtered out.

COMPARATIVE EXAMPLE 4

Synthesis of Copolymer 9

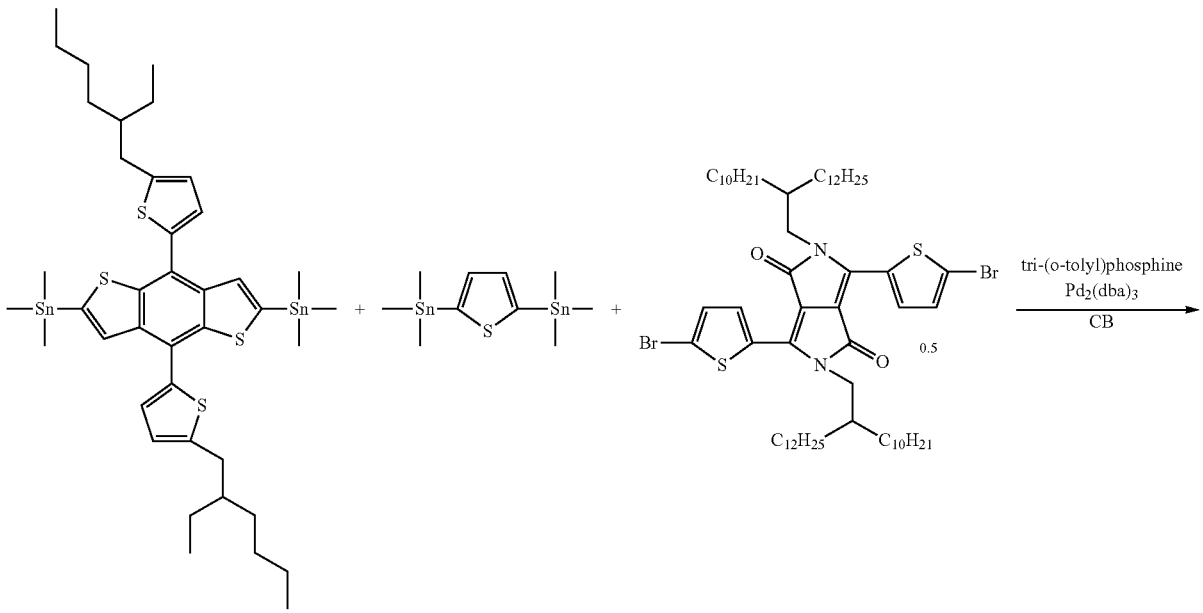

-continued

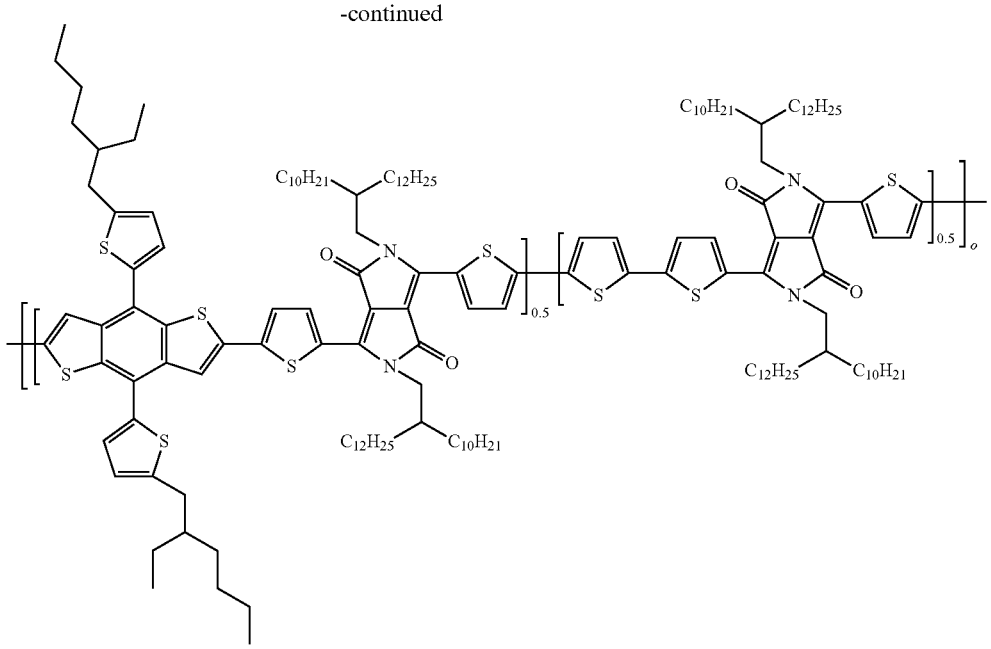

15 ml of chlorobenzene, 2,6-bis(trimethyltin)-4,8-bis(2-ethylhexyl-2-thienyl)-benzo[1,2-b:4,5-b']dithiophene (0.7 g, 0.7738 mmol), 2,5-bis(trimethylstannyl)thiophene (0.3171 g, 0.7738 mmol), 1,3-dibromo-5-octylthieno[3,4-c]pyrrole-4,6-dione (1.751 g, 1.548 mmol), 28 mg of tris(dibenzylideneacetone)dipalladium(0) ($Pd_2(dba)_3$), and 37 mg of tri-(o-tolyl)phosphine were put into a microwave reactor vial, and reacted under the condition of 170° C. for 1 hour. After the mixture was cooled to room temperature and poured into methanol, the solid was filtered and Soxhlet extracted with methanol, acetone, hexane, and chloroform, and then the chloroform part was precipitated again in methanol and the solid was filtered out.

Manufacture of Organic Solar Cell and Measurement of Characteristics Thereof

EXPERIMENTAL EXAMPLE 1

Manufacture-1 of Organic Solar Cell

A composite solution was prepared by dissolving Copolymer 1 prepared in Example 1 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 1-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3 \times 10^{-8}$ torr.

EXPERIMENTAL EXAMPLE 2

Manufacture-2 of Organic Solar Cell

A composite solution was prepared by dissolving Copolymer 2 prepared in Example 2 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 2-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3 \times 10^{-8}$ torr.

EXPERIMENTAL EXAMPLE 3

Manufacture-3 of Organic Solar Cell

A composite solution was prepared by dissolving Copolymer 3 prepared in Example 3 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 3-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

EXPERIMENTAL EXAMPLE 4

Manufacture-4 of Organic Solar Cell

A composite solution was prepared by dissolving Copolymer 4 prepared in Example 4 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 4-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

EXPERIMENTAL EXAMPLE 5

Manufacture-5 of Organic Solar Cell

A composite solution was prepared by dissolving Copolymer 5 prepared in Example 5 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 5-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

COMPARATIVE EXPERIMENTAL EXAMPLE 1

Manufacture-6 of Organic Solar Cell

A composite solution was prepared by dissolving Copolymer 6 prepared in Comparative Example 1 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 6-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

COMPARATIVE EXPERIMENTAL EXAMPLE 2

Manufacture-7 of Organic Solar Cell

A composite solution was prepared by dissolving Copolymer 7 prepared in Comparative Example 2 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 7-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

COMPARATIVE EXPERIMENTAL EXAMPLE 3

Manufacture-8 of Organic Solar Cell

A composite solution was prepared by dissolving Copolymer 8 prepared in Comparative Example 3 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 8-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

COMPARATIVE EXPERIMENTAL EXAMPLE 4

Manufacture-9 of Organic Solar Cell

A composite solution was prepared by dissolving Copolymer 8 prepared in Comparative Example 3 and $PC_{61}BM$ at a ratio of 1:3 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:

PSS (Baytrom P) with a thickness of 45 nm. For coating the photoactive layer, a Copolymer 8-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

COMPARATIVE EXPERIMENTAL EXAMPLE 5

Manufacture-10 of Organic Solar Cell

A composite solution was prepared by dissolving Copolymer 9 prepared in Comparative Example 4 and $PC_{61}BM$ at a ratio of 1:2 in chlorobenzene (CB). In this case, the concentration was adjusted to 4.0 wt %, and the organic solar cell was made to have a structure of ITO/PEDOT:PSS/a photoactive layer/Al. A glass substrate coated with ITO was ultrasonically washed using distilled water, acetone, and 2-propanol, the ITO surface was treated with ozone for 10 minutes, and then heat treatment was performed at 120° C. for 10 minutes by spin-coating PEDOT:PSS (Baytrom P) with a thickness of 45 nm. For coating the photoactive layer, a Copolymer 9-$PC_{61}BM$ composite solution was filtered with a 0.45 μm PP syringe filter and spin-coated, and then an organic solar cell was manufactured by depositing Al in a thickness of 200 nm using a thermal evaporator under a vacuum of $3\times10^{-8}$ torr.

TEST EXAMPLE 1

The photoelectric conversion characteristics of the organic solar cells manufactured in Experimental Examples 1 to 5 and Comparative Experimental Examples 1 to 5 were measured at the condition of 100 mW/cm$^2$ (AM 1.5), and the results are shown in the following Table 1.

In Table 1, $V_{oc}$, $J_{sc}$, FF, and PCE mean an open-circuit voltage, a short-circuit current, a fill factor, and an energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open circuit voltage. The energy conversion efficiency may be obtained when these three values are divided by the intensity of the irradiated light, and the higher value is preferred.

When Experimental Examples 1 to 5 are compared with Comparative Experimental Examples 1 to 4, it can be confirmed that the case where the side chain of the main chain of the copolymer includes a conjugated structure has better efficiency of the organic solar cell than the case where the side chain of the main chain of the copolymer does not include a conjugated structure.

Furthermore, when Experimental Examples 1 to 5 are compared with Comparative Experimental Example 5, it can be confirmed that the case of including all of the first unit, the second unit, and the third unit of the present application has better efficiency of the organic solar cell than the case of including only the first unit and the third unit of the present application.

The invention claimed is:

1. A copolymer comprises a unit represented by the following Formula 4:

TABLE 1

| | Active layer | $V_{oc}$ (V) | $J_{sc}$ (mA/cm$^2$) | FF (%) | PCE (%) |
|---|---|---|---|---|---|
| Experimental Example 1 | Copolymer 1/$PC_{61}BM$ = 1:2 | 0.85 | 10.3 | 60.4 | 5.29 |
| Experimental Example 2 | Copolymer 2/$PC_{61}BM$ = 1:2 | 0.89 | 9.1 | 58.2 | 4.71 |
| Experimental Example 3 | Copolymer 3/$PC_{61}BM$ = 1:2 | 0.84 | 10.0 | 56.0 | 4.70 |
| Experimental Example 4 | Copolymer 4/$PC_{61}BM$ = 1:2 | 0.79 | 8.6 | 61.0 | 4.14 |
| Experimental Example 5 | Copolymer 5/$PC_{61}BM$ = 1:2 | 0.88 | 9.8 | 57.8 | 4.98 |
| Comparative Experimental Example 1 | Copolymer 6/$PC_{61}BM$ = 1:2 | 0.81 | 7.2 | 56.3 | 3.28 |
| Comparative Experimental Example 2 | Copolymer 7/$PC_{61}BM$ = 1:2 | 0.81 | 6.6 | 59.7 | 3.19 |
| Comparative Experimental Example 3 | Copolymer 8/$PC_{61}BM$ = 1:2 | 0.85 | 8.6 | 43.0 | 3.14 |
| Comparative Experimental Example 4 | Copolymer 8/$PC_{61}BM$ = 1:3 | 0.78 | 6.2 | 42 | 2.05 |
| Comparative Experimental Example 5 | Copolymer 9/$PC_{61}BM$ = 1:2 | 0.68 | 0.9 | 50.1 | 0.32 |

[Formula 4]

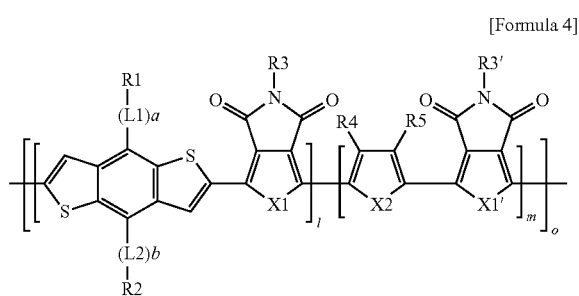

in Formula 4, a and b are each an integer of 1 to 3, when a is 2 or more, two or more L1's are the same as or different from each other, when b is 2 or more, two or more L2's are the same as or different from each other, L1 and L2 are the same as or different from each other, and each independently have a conjugated structure, R1 and R2 are the same as or different from each other, and are each independently, as a substituent to be substituted in the conjugated structure of L1 and L2, one or two or more selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group including one or more of N, O, and S atoms, X1 and X2 are the same as or different from each other, and are each independently CRR', NR, O, SiRR', PR, S, GeRR', Se or Te, and R, R' and R3 to R5 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group including one or more of N, O, and S atoms, X1' is the same as or different from X1, and is each independently the same as a definition of X1, R3' is the same as or different from R3, and is each independently the same as a definition of R3, l is a molar ratio, and 0<l<1, m is a molar ratio, and 0<m<1, l+m=1, and o is an integer with 0<o<1,000.

2. The copolymer of claim 1, wherein the conjugated structure comprises: an arylene group; an aromatic heterocyclic group comprising one or more of N, O, S, Se, Te, Ge, and P atoms; or one or two or more vinylene groups.

3. The copolymer of claim 1, wherein R1 and R2 are the same as or different from each other, and are each independently a substituted or unsubstituted, straight or branched alkyl group having 1 to 20 carbon atoms; or a substituted or unsubstituted, straight or branched alkoxy group having 1 to 20 carbon atoms.

4. The copolymer of claim 1, wherein R3 to R5 are the same as or different from each other, and are each independently hydrogen; or a substituted or unsubstituted, straight or branched alkyl group having 1 to 20 carbon atoms.

5. The copolymer of claim 1, wherein the copolymer has a number average molecular weight of 500 g/mol to 1,000,000 g/mol.

6. The copolymer of claim 1, wherein the copolymer has a molecular weight distribution of 1 to 100.

7. The copolymer of claim 1, wherein the copolymer is a random copolymer.

8. An organic solar cell comprising:
a first electrode;
a second electrode provided to face the first electrode; and
an organic material layer comprising one or more layers, which is provided between the first electrode and the second electrode and comprises a photoactive layer,
wherein one or more layers of the organic material layer comprise the copolymer of claim 1.

9. The organic solar cell of claim 8, wherein the organic material layer comprises a hole transport layer, a hole injection layer, or a layer which simultaneously transports and injects holes, and
the hole transport layer, the hole injection layer, or the layer which simultaneously transports and injects holes comprises the copolymer.

10. The organic solar cell of claim 8, wherein the organic material layer comprises an electron injection layer, an electron transport layer, or a layer which simultaneously injects and transports electrons, and
the electron injection layer, the electron transport layer, or the layer which simultaneously injects and transports electrons comprises the copolymer.

11. The organic solar cell of claim 8, wherein the photoactive layer comprises one or two or more selected from the group consisting of an electron donor and an electron acceptor, and the electron donor comprises the copolymer.

12. The organic solar cell of claim 11, wherein the electron donor and the electron acceptor constitute a bulk heterojunction (BHJ).

13. The organic solar cell of claim 8, wherein the photoactive layer has a bilayer thin film structure comprising an n-type organic material layer and a p-type organic material layer, and the p-type organic material layer comprises the copolymer.

14. The organic solar cell of claim 8, wherein the organic solar cell further comprises one or two or more organic material layers selected from the group consisting of a hole injection layer, a hole transport layer, a hole blocking layer, a charge generation layer, an electron blocking layer, an electron injection layer, and an electron transport layer.

* * * * *